United States Patent
Thompson et al.

(10) Patent No.: US 10,439,572 B1
(45) Date of Patent: Oct. 8, 2019

(54) ANALOG-TO-DIGITAL CONVERTER USING DISCRETE TIME COMPARATOR AND SWITCHED CAPACITOR CHARGE PUMP

(71) Applicant: Analog Devices Global Unlimited Company, Hamilton (BM)

(72) Inventors: Frederick Carnegie Thompson, Foynes (IE); Riccardo Tonietto, Valencia (ES)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/053,415

(22) Filed: Aug. 2, 2018

Related U.S. Application Data

(60) Provisional application No. 62/711,820, filed on Jul. 30, 2018.

(51) Int. Cl.
| | |
|---|---|
| *H03M 1/40* | (2006.01) |
| *H03M 1/44* | (2006.01) |
| *H03F 3/45* | (2006.01) |
| *H02M 3/07* | (2006.01) |
| *H03M 3/00* | (2006.01) |

(52) U.S. Cl.
CPC .......... *H03F 3/45179* (2013.01); *H02M 3/07* (2013.01); *H03M 1/403* (2013.01); *H03M 1/442* (2013.01); *H03M 3/458* (2013.01); *H03F 2203/45084* (2013.01)

(58) Field of Classification Search
CPC ...... H03M 3/458; H03M 1/403; H03M 1/442; H03F 3/45179
USPC .......................................... 341/130–143, 155
See application file for complete search history.

(56) References Cited

U.S. PATENT DOCUMENTS

| | | | |
|---|---|---|---|
| 5,289,137 A | 2/1994 | Nodar et al. | |
| 5,495,200 A | 2/1996 | Kwan et al. | |
| 5,631,606 A | 5/1997 | Tran | |
| 5,734,975 A * | 3/1998 | Zele | H04H 20/31 327/554 |

(Continued)

FOREIGN PATENT DOCUMENTS

EP     2156560     5/2018

OTHER PUBLICATIONS

Fiorenza, John K., et al., "Comparator-Based Switched-Capacitor Circuits for Scaled CMOS Technologies", IEEE Journal of Solid-State Circuits, vol. 41, No. 12, (Dec. 2006), 2664-2668.

(Continued)

*Primary Examiner* — Lam T Mai
(74) *Attorney, Agent, or Firm* — Schwegman Lundberg & Woessner, P.A.

(57) ABSTRACT

An "all-digital" operational amplifier architecture, that does not have the constraint of maintaining devices in their saturation region, can leverage the high speed achievable by deeply scaled technology to replace traditional linear current referenced continuous-time operational amplifier circuits with CMOS-like dynamic circuits that require no referencing structure, have no static power consumption, and are compatible with ultra-low supply voltages. Techniques are described to replace analog continuous-time linear operational amplifier input and output stages by a discrete-time comparator circuit, e.g., CMOS-style, and a switched capacitor charge pump circuit, respectively.

19 Claims, 3 Drawing Sheets

(56) References Cited

U.S. PATENT DOCUMENTS

| | | | |
|---|---|---|---|
| 5,777,512 A * | 7/1998 | Tripathi | H03F 3/217 |
| | | | 330/110 |
| 7,245,245 B2 | 7/2007 | Chien | |
| 7,450,048 B2 * | 11/2008 | Lin | H03F 3/005 |
| | | | 327/157 |
| 8,093,941 B2 | 1/2012 | Hunter et al. | |
| 8,289,074 B2 | 10/2012 | Yamamoto et al. | |
| 9,252,660 B2 | 2/2016 | Burlingame et al. | |
| 2014/0070976 A1 * | 3/2014 | Hurrell | G11C 27/02 |
| | | | 341/172 |

OTHER PUBLICATIONS

Fiorenza, John K., et al., "Comparator-Based Switched-Capacitor Circuits for Scaled CMOS Technologies", IEEE Journal of Solid-State Circuits, vol. 41, No. 12, (Dec. 2006), 2658-2663.

Gregoire, B. Robert, "A Compact Switched-Capacitor Regulatred Charge Pump Power Supply", IEEE Journal of Solid-State Circuits, vol. 41, No. 8, (Aug. 2006), 10 pages.

* cited by examiner

ANALOG-TO-DIGITAL CONVERTER USING DISCRETE TIME COMPARATOR AND SWITCHED CAPACITOR CHARGE PUMP

CLAIM OF PRIORITY

This application claims the benefit of priority of U.S. Provisional Patent Application Ser. No. 62/711,820, titled "ANALOG-TO-DIGITAL CONVERTER USING DISCRETE TIME COMPARATOR AND SWITCHED CAPACITOR CHARGE PUMP" to Frederick C. Thompson et al., filed on Jul. 30, 2018, the entire contents of which being incorporated herein by reference.

FIELD OF THE DISCLOSURE

This document pertains generally, but not by way of limitation, to integrated circuits, and more particularly, to analog-to-digital converter circuits and systems.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

An "all-digital" operational amplifier architecture, that does not have the constraint of maintaining devices in their saturation region, can leverage the high speed achievable by deeply scaled technology to replace traditional linear current referenced continuous-time operational amplifier circuits with CMS-like dynamic circuits that require no referencing structure, have no static power consumption, and are compatible with ultra-low supply voltages. Using the techniques of this disclosure, analog continuous-time linear operational amplifier input and output stages can be replaced by a discrete-time comparator circuit, e.g., CMOS-style, and a switched capacitor charge pump circuit, respectively.

In some aspects, this disclosure is directed to a low voltage and power efficient operational amplifier circuit. The operational amplifier circuit comprises a comparator circuit including: first and second comparator inputs, the first comparator input to receive an input signal, and the second comparator input coupled to a reference voltage; and a comparator output. The operational amplifier circuit comprises a switched capacitor charge pump circuit including: an input coupled to the comparator output and a control signal input to receive a control signal; and at least one capacitor, wherein, the switched capacitor charge pump circuit is configured, based on the comparator output, to control a transfer of a charge from the at least one capacitor to an output of the operational amplifier circuit using the control signal.

In some aspects, this disclosure is directed to a low voltage and power-efficient analog-to-digital converter (ADC) circuit comprising: an operational amplifier circuit including: a comparator circuit including: first and second comparator inputs, the first comparator input to receive an input signal, and the second comparator input coupled to a reference voltage; and a comparator output; a switched capacitor charge pump circuit including: an input coupled to the comparator output and a control signal input to receive a control signal; and at least one capacitor, wherein, based on the comparator output, the switched capacitor charge pump circuit is configured to control a transfer of a charge from the at least one capacitor to an output of the operational amplifier circuit using the control signal.

In some aspects, this disclosure is directed to a method of operating a low voltage and power efficient operational amplifier circuit, the method comprising: comparing an input signal to a reference voltage; generating an output based on the comparison; applying the output to a switched capacitor charge pump circuit; and based on the output, controlling a transfer of an amount of charge from the switched capacitor charge pump circuit to an output of the operational amplifier circuit using a control signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Eke numerals having different letter suffixes may represent different instances of similar components. The drawings illustrate generally, by way of example, but not by way of limitation, various embodiments discussed in the present document.

DETAILED DESCRIPTION

Various analog-to-digital converter (ADC) topologies exist, including sigma-delta, successive approximation register (SAR), flash, cyclic, and pipelined converters. Traditional current referenced linear operational amplifiers used in fundamental building blocks of some ADCs, e.g., an integrator circuit of a sigma-delta ADC, can be high gain and low noise circuits that have active devices referenced around a linear operating point and that operate in their saturation region. It can be difficult to achieve a robust solution with such design challenges under very low voltage and power constraints.

The present inventors have recognized that an "all-digital" operational amplifier architecture, that does not have the constraint of maintaining devices in their saturation region, can leverage the high speed achievable by deeply scaled technology to replace traditional linear current referenced continuous-time operational amplifier circuits with CMOS-like dynamic circuits that require no referencing structure, have no static power consumption, and are compatible with ultra-low supply voltages. Using the techniques of this disclosure, analog continuous-time linear operational amplifier input and output stages can be replaced by a discrete-time comparator circuit, e.g., CMOS-style, and a switched capacitor charge pump circuit, respectively.

The comparator circuit and the switched capacitor charge pump circuit can operate, for example, at the lowest supply compatible with standard CMOS logic and can have no static dissipation of power, thereby achieving robustness and ultra-low power capability in deeply scaled technology. In addition, the comparator circuit and the switched capacitor charge pump circuit techniques of this disclosure need less headroom than analog continuous-time linear circuits.

Figure 1:
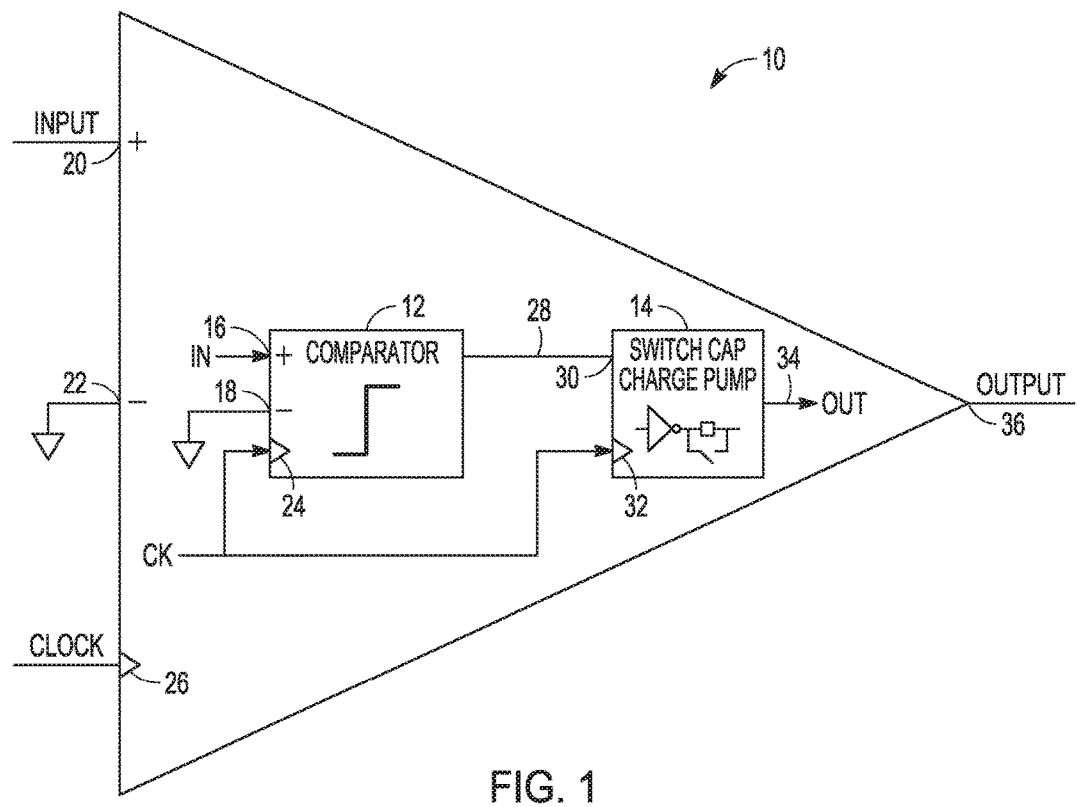
FIG. 1 is an example of an operational amplifier circuit that can be used to implement various techniques of this disclosure.

FIG. 1 is an example of an operational amplifier circuit that can be used to implement various techniques of this disclosure. The operational amplifier circuit 10 can include a comparator circuit 12 and a switched capacitor charge pump circuit 14.

As seen in FIG. 1, the comparator circuit 12 can include a first input 16, e.g., a non-inverting input, to receive an input signal, and a second input 18, e.g., an inverting input, coupled to a reference voltage such as ground. The inputs 16, 18 of the comparator circuit 12 can be coupled, respectively, to inputs 20, 22 of the operational amplifier circuit 10.

In the example in FIG. 1, the comparator circuit 12 is shown as a synchronous comparator circuit and can include a control signal input to receive a control signal, e.g., a clock input 24 to receive a clock signal. The comparator circuit 12 can be configured to operate at a fixed clock rate using the clock signal. The clock input 24 of the comparator circuit can be coupled to the clock input 26 of the operational amplifier circuit 10.

An output 28 of the comparator circuit 12 can be coupled to an input 30 of the switched capacitor charge pump circuit 14. The switched capacitor charge pump circuit 14 can further include a clock input 32 to receive a clock signal, e.g., the same clock signal applied to the comparator circuit 12 and can include an output 34 coupled to an output 36 of the operational amplifier circuit.

An example of a switched capacitor charge pump circuit 14 is shown and described below with respect to FIG. 2. The switched capacitor charge pump circuit 14 can include one or more capacitors and can be configured, based on the comparator output, to control a transfer of a charge from the capacitor(s) to an output of the operational amplifier circuit, e.g., and on to a feedback capacitor.

In operation, when the output of the comparator circuit 12 toggles, charge can be added to or removed from the output 36. A control circuit, e.g., control circuit 88 of FIG. 4, can continue to control the comparator circuit 12 until a voltage at the output 36 is within a desired range of voltages. By using a switched capacitor charge pump approach, as described in this disclosure, a fixed amount of charge from the capacitor(s) of the switched capacitor charge pump 14 can be added to or removed from the output 36 each time the comparator circuit 12 is clocked, for example.

For example, the output 34 of the switched capacitor charge pump circuit 14 (and thus the output 36 of the operational amplifier circuit) can be coupled to a feedback capacitor such as an integrator capacitor when the operational amplifier circuit is configured to be a part of an integrator circuit, e.g., in a sigma-delta ADC. Using the techniques of this disclosure, a comparator circuit and a switched capacitor charge pump circuit can add charge to or remove charge from an integration capacitor, for example.

In contrast to the switched capacitor charge pump approach of this disclosure in which a capacitor is coupled to an output node, a current source can be coupled to an output node. Switching in a current source can provide a fixed amount of current for the amount of time that the current is coupled to the output node. The amount of charge depends on the amount of time that the current source is switched on and delivering current. However, it can take a certain amount of time for a comparator circuit to realize that the amount of charge added to or removed from the output node has exceeded the desired value, e.g., trip point, and then turn off the current source. In this manner, the current source approach can cause errors due to the propagation time of the comparator circuit.

In addition, the current source approach can have a headroom limitation in order for the approach to operate correctly. In contrast, the switched capacitor charge pump approach of this disclosure has no such headroom limitation. Rather, the switched capacitor charge pump approach can go beyond the supply rails.

Figure 2:
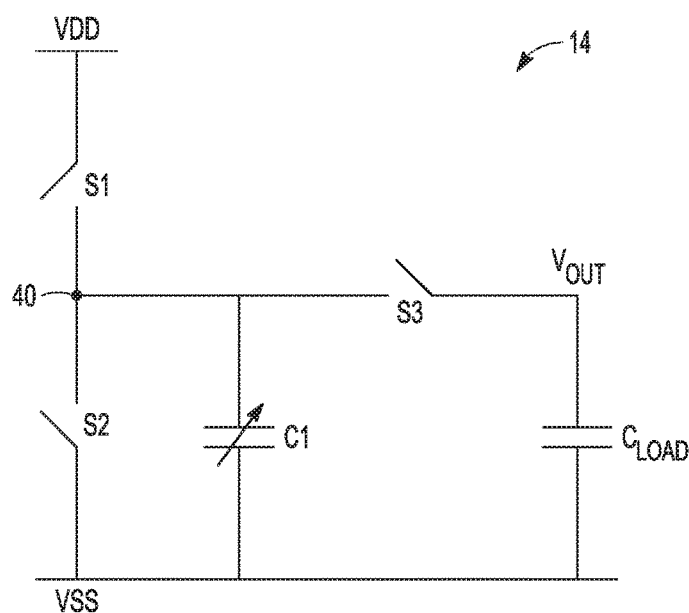
FIG. 2 is an example of a switched capacitor charge pump circuit that can be used to implement various techniques of this disclosure.

FIG. 2 is an example of a switched capacitor charge pump circuit 14 that can be used to implement various techniques of this disclosure. The switched capacitor charge pump circuit 14 can include switches S1 and S2 coupled in series between supply voltages VDD and VSS, and a capacitor C1, e.g., a variable capacitor, coupled to a node 40 between switches S1 and S2 and to the supply voltage VSS. The circuit 14 can further include a load capacitor Cload coupled in parallel with the capacitor C1, and a switch S3 coupled between the top plates of capacitors C1 and Cload. The capacitor Cload represents the load seen at the output of the "all-digital" operational amplifier circuit of FIGS. 1 and 3. For example, the capacitor Cload can represent the integration capacitor 76 in FIG. 4 and the load of the next stage, e.g., the second capacitor summing node 72 in FIG. 4. Or, the capacitor Cload can represent the comparator circuit 82 of FIG. 4.

Figure 3:
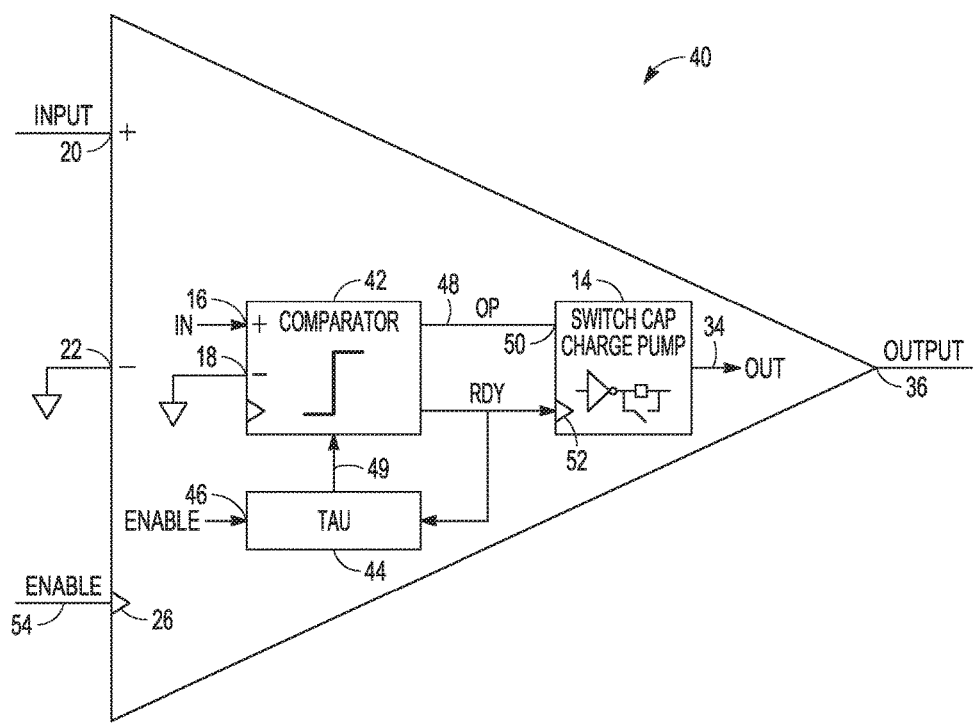
FIG. 3 is another example of an operational amplifier circuit that can be used to implement various techniques of this disclosure.
Figure 4:
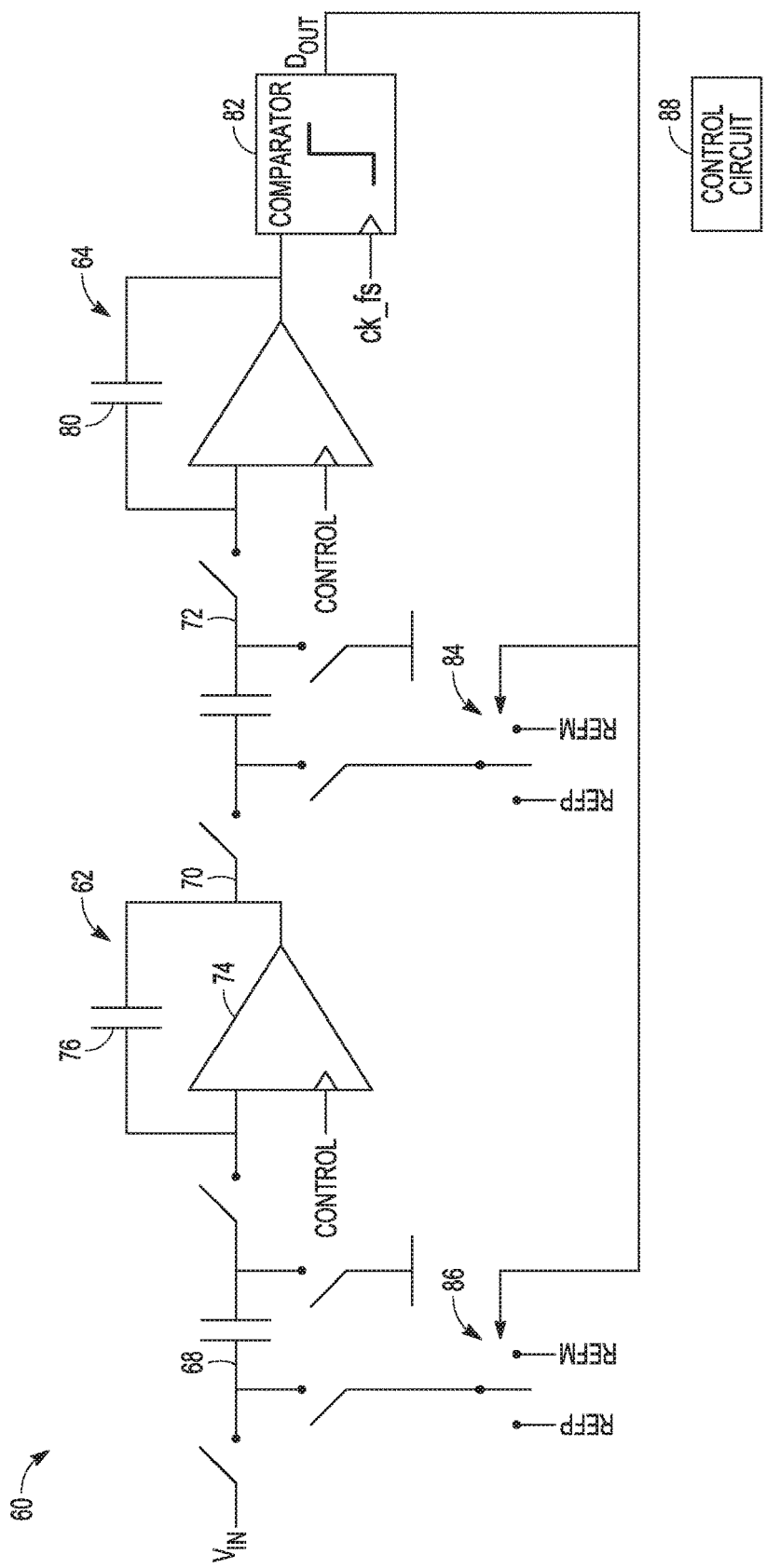
FIG. 4 is an example of a sigma-delta analog-to-digital converter circuit that can implement various techniques of this disclosure.

In operation, a control circuit, e.g., control circuit 88 of FIG. 4, can control the switches S1-S3 to switch in the capacitor C1 at each change in the output of the comparator circuit. Each time the control signal is applied, e.g., a clock signal or other control signal, the switched capacitor charge pump circuit 14 can output charge to the load capacitor Cload at its output. In some example implementations, when the clock signal goes low, the circuit 14 can reset the capacitor C1, e.g., a variable capacitor. In some examples, the switched capacitor charge pump circuit 14 can begin by outputting a large amount of charge to the load capacitor Cload at its output, e.g., and to an integration capacitor or other feedback capacitor coupled to the output. Based on the output of the comparator circuit, e.g., comparator circuit 12 of FIG. 1 or comparator circuit 42 of FIG. 3, the switched capacitor charge pump circuit 14 can adjust the charge on the capacitor C1, e.g., by adjusting the capacitance of the variable capacitor C1, to improve the resolution. It should be noted that in some example implementations, if there is overshoot, charge can be removed from a feedback capacitor, e.g., an integration capacitor, coupled to the output of the switched capacitor charge pump circuit.

In contrast to the fixed clock rate comparator circuit 12 of FIG. 1, it can be desirable in some example configurations to use a "self-timed" comparator circuit, such as described below with respect to FIG. 3. In such a configuration, a high-speed clock signal does not need to be used. Rather, a control signal other than a clock signal can be applied to the comparator circuit to begin a comparison, e.g., as part of an analog-to-digital conversion process, and the comparator circuit can continue to operate until the enable signal is removed.

FIG. 3 is another example of an operational amplifier circuit that can be used to implement various techniques of this disclosure. The operational amplifier circuit 40 can include a comparator circuit 42 and a switched capacitor charge pump circuit 14.

As seen in FIG. 3, the comparator circuit 42 can include a first input 16, to receive an input signal, and a second input 18, e.g., coupled to a reference voltage such as ground. The inputs 16, 18 of the comparator circuit can be coupled, respectively, to inputs 20, 22 of the operational amplifier circuit 40.

In the example in FIG. 3, the comparator circuit is shown as an asynchronous comparator circuit, or "self-timed" comparator circuit. The comparator circuit 42 can include a delay circuit 44 (labeled "Tau") to control operation of the comparator. The delay circuit 44 can include a control signal input 46 to receive a control signal, e.g., an enable input to receive an enable signal, and output a control signal 48 to the comparator 42..

An output 48 of the comparator circuit 42 can be coupled to an input 50 of the switched capacitor charge pump circuit 14. The switched capacitor charge pump circuit 14 can also include an input 52 to receive a ready signal from the comparator, which can also be applied to the delay circuit 44. The switched capacitor charge pump circuit 14, e.g., the switched capacitor charge pump circuit of FIG. 2, can include an output 34 coupled to an output 36 of the operational amplifier circuit.

In operation, when the output of the comparator circuit 42 toggles, charge can be added to or removed from the output 34. In some example configurations, the comparator circuit 42 can generate a differential output, e.g., an output having two different polarities. After the comparator circuit 42 has been reset, both outputs can be at the same logic level, e.g., logic high. The delay circuit 44 can detect when the comparator 42 has made a decision based on the comparator outputs being at two different logic levels. When the delay circuit 44 detects that the comparator 42 has made a decision, the delay circuit 44 can output, after a delay, a control signal 49 to the comparator 42 to control the comparator to make another decision. The comparator 42 can then update the switched capacitor charge pump circuit 14. In this manner, the comparator circuit 42 can make the next comparison when ready, rather than having to wait for a clock signal.

By using a switched capacitor charge pump approach, as described in this disclosure, a fixed amount of charge from the capacitor(s) can be added to or removed from the output 34 each time the comparator circuit is clocked. For example, the output 34 of the switched capacitor charge pump circuit (and thus the output 36 of the operational amplifier circuit) can be coupled to a feedback capacitor, e.g., an integrator capacitor when the operational amplifier circuit is configured to be a part of an integrator circuit, such as in a sigma-delta ADC. Using the techniques of this disclosure, a comparator circuit and a switched capacitor charge pump circuit can add or remove charge onto the integration capacitor or other feedback capacitor, for example.

In some examples, the self-timed comparator circuit of FIG. 3 can operate more quickly than the fixed clock rate comparator circuit of FIG. 1 because the circuit of FIG. 3 is only limited by how quickly the comparator can operate. Advantageously, there are no high-speed loops outside of the comparator circuit. An enable signal 54 can be applied to begin a comparison, e.g., as part of a conversion process, and the comparator circuit can continue to operate until the enable signal is removed. Further, the self-timed compared circuit of FIG. 3 can eliminate a clock signal. For example, without the self-timed comparator circuit, the ADC of FIG. 4 would need two clocks: one for the comparator circuit 82 and a faster one to each operational amplifier circuit 62, 64.

FIG. 4 is an example of a sigma-delta ADC circuit 60 that can implement various techniques of this disclosure. Although the sigma-delta ADC circuit 60 of FIG. 4 is depicted as a second order sigma-delta ADC, the techniques of this disclosure can be applied to first order sigma-delta ADC circuits or sigma-delta ADC circuits higher than a second order. In addition, the sigma-delta ADC circuit 60 of FIG. 4 is depicted as a single-end ADC circuit, but the techniques of this disclosure are applicable to differential configurations. The operation of a sigma-delta ADC circuit is well known to those of ordinary skill in the art and, as such, will not be described in detail in this disclosure.

The second order sigma-delta ADC circuit 60 can include two filter circuits 62, 64. Fn some example configurations, the filter circuits 62, 64 can be integrator circuits. An input voltage $V_{IN}$ can be summed with an output 66 of a feedback digital-to-analog converter (DAC) circuit. This summing can be accomplished by a switched capacitor circuit, for example, that accumulates charge onto a first capacitor summing node 68. The first filter circuit 62 can add the output of the first summing node 68 to a stored value from a previous integration operation.

An output 70 of the first filter circuit 62 can also be summed with the output of the feedback DAC circuit. This second summing can be accomplished by another switched capacitor circuit, for example, that accumulates charge onto a second capacitor summing node 72. The second filter circuit 64 can add the output of the second summing node to a stored value from a previous integration operation.

The first filter circuit 62 can include a first operational amplifier circuit 74 and a first integration capacitor 76, and the second integrator circuit 64 can include a second operational amplifier circuit 78 and a second integration capacitor 80. In accordance with this disclosure, one or both of the first and second operational amplifiers 74, 78 can be configured as either the operational amplifier circuit 10 of FIG. 1 or the operational amplifier circuit 40 of FIG. 3. In this manner, the first and second operational amplifiers 74, 78 can use a comparator and a switched capacitor charge pump configuration, in contrast with approaches that use an analog continuous time linear circuit.

In some examples, a comparator circuit 82 can output a logic 1 if the output of the second filter circuit 64 is greater than or equal to zero volts and output a logic 0 otherwise. DAC circuits 84, 86 can be fed from the output of the comparator circuit 82 back to both the first and second summing nodes 68, 72. For example, the DAC circuits 84, 86 can couple a positive voltage reference $+V_{REF}$ to a summing node for logic 1 and can couple a negative voltage reference $-V_{REF}$ to a summing node for logic 0. The feedback 66 tries to keep the output of the filter circuits 62, 64, e.g., integrator circuits, at zero by making the ones and zeros output of the comparator 82 equal to the analog input.

As described above, when the comparator circuit of an operational amplifier circuit toggles, e.g., operational amplifier circuits 74, 78, charge can be added to or removed from the output of the operational amplifier circuit. The operational amplifier circuit can thus add or remove charge from a capacitor, e.g., capacitors 76, 80, based on the comparator output. A control circuit 88 can continue to control the comparator circuit of an operational amplifier circuit, e.g., operational amplifier circuits 74, 78, until a voltage at the output of the operational amplifier circuit is within a desired range of voltages. Based on the output of the comparator circuit of the operational amplifier circuit, the switched capacitor charge pump circuit of the operational amplifier circuit can adjust the charge on one or more capacitors of the charge pump circuit to improve the resolution. For example, the control circuit 88 can adjusting the capacitance of the variable capacitor C1 of the switched capacitor charge pump circuit 14 of FIG. 2 to adjust the charge.

In addition to sigma-delta ADC circuits, the techniques of this disclosure are applicable to other types of ADC circuits. For example, the operational amplifier circuits of FIGS. 1 and 3 can be used in pipelined ADC circuits and cyclic ADC circuits.

In some examples, the pipelined ADC circuits can be implemented using switched capacitor circuits. An example of a pipelined ADC circuit using a switched capacitor structure is described in commonly assigned U.S. Pat. No. 7,026,968 the entire contents of which being incorporated herein by reference.

In some examples, the cyclic ADC circuits can be implemented using switched capacitor circuits. An example of a cyclic ADC circuit is described in commonly assigned U.S. Pat. No. 7,312,734, the entire contents of which being incorporated herein by reference.

In addition to ADC circuits, the techniques of this disclosure are applicable to other types of circuits. For example, the operational amplifier circuits of FIGS. I and 3 can be used in filter circuits. In some examples, the filter circuits can be implemented using switched capacitor circuits. Examples of switched capacitor filter circuits are described in commonly assigned U.S. Pat. Nos. 5,479,130 and 5,495,200, the entire contents of each being incorporated herein by reference.

As mentioned above, the techniques of this disclosure can provide advantages over other approaches, such as a continuous time approach. For example, in a continuous time approach, a few hundred millivolts between a supply rail and an output may be needed so that the output device does not go out of saturation. In contrast, the switched capacitor charge pump of the operational amplifier circuit of this disclosure also the circuit to operate up to the supply voltage and beyond, thereby improving the headroom over other approaches.

In addition, if switching in a current source, as in some continuous time approaches, the current source would need to be kept in saturation. in contrast, the field-effect transistors (FETs) of the switched capacitor charge pump of the operational amplifier circuit of this disclosure go out of saturation in order to operate properly as switches. Finally, the techniques of this disclosure can be more power efficient than switched current approaches because switched current sources need to remain on during operation.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples, An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like, The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with The claimed invention is:

1. A low voltage and power efficient operational amplifier circuit comprising:
   a comparator circuit including:
      first and second comparator inputs, the first comparator input to receive an input signal, and the second comparator input coupled to a reference voltage; and
      a comparator output; and
   a switched capacitor charge pump circuit including:
      an input coupled to the comparator output and a control signal input to receive a control signal; and
      at least one capacitor,
   wherein, the switched capacitor charge pump circuit is configured, based on the comparator output, to control a transfer of a charge from the at least one capacitor to an output of the operational amplifier circuit using the control signal, and either i) or ii):
   i) wherein the comparator circuit further includes a first clock input to receive a clock signal, wherein the control signal input of the switched capacitor charge pump is a second clock input configured to receive the clock signal, and wherein the comparator circuit is configured to operate at a fixed clock rate using the clock signal,
   ii) wherein the comparator circuit is self-timed, and wherein the control signal is an enable signal.

2. The operational amplifier circuit of claim 1, in combination with an analog-to-digital converter circuit.

3. The operational amplifier circuit of claim 2, wherein the analog-to-digital converter circuit is a sigma-delta analog-to-digital converter circuit.

4. The operational amplifier circuit of claim 1, wherein the comparator circuit further includes a first clock input to receive a clock signal, wherein the control signal input of the switched capacitor charge pump is a second clock input configured to receive the clock signal, and wherein the comparator circuit is configured to operate at a fixed clock rate using the clock signal.

5. The operational amplifier circuit of claim 1, wherein the comparator circuit is self-timed, and wherein the control signal is an enable signal.

6. The operational amplifier circuit of claim 1, in combination with a switched capacitor circuit.

7. The operational amplifier circuit of claim 1, wherein the switched capacitor circuit is a filter circuit.

8. A low voltage and power-efficient analog-to-digital converter (ADC) circuit comprising:
   an operational amplifier circuit including:
      a comparator circuit including:
         first and second comparator inputs, the first comparator input to receive an input signal, and the second comparator input coupled to a reference voltage; and
         a comparator output;
      a switched capacitor charge pump circuit including:
         an input coupled to the comparator output and a control signal input to receive a control signal; and.
         at least one capacitor,
      wherein, based on the comparator output, the switched capacitor charge pump circuit is configured to control a transfer of a charge from the at least one capacitor to an output of the operational amplifier circuit using the control signal, and either i) or ii):
   i) wherein the comparator circuit is a synchronous comparator circuit configured to operate at a fixed clock rate using a clock signal,
   ii) wherein the comparator circuit is an asynchronous comparator circuit, and wherein the control signal is an enable signal.

9. The ADC circuit of claim 8, wherein the ADC circuit is a sigma-delta ADC circuit including an integrator circuit, and wherein the integrator circuit includes the operational amplifier circuit.

10. The ADC circuit of claim 8, wherein the ADC circuit is a pipelined ADC circuit.

11. The ADC circuit of claim 8, wherein the ADC circuit is a cyclic ADC circuit.

12. The analog-to-digital converter circuit of claim 8, wherein the comparator circuit is a synchronous comparator circuit configured to operate at a fixed clock rate using a clock signal.

13. The analog-to-digital converter circuit of claim 8, wherein the comparator circuit is asynchronous, and wherein the control signal is an enable signal.

14. A method of operating a low voltage and power efficient operational amplifier circuit, the method comprising:
   comparing an input signal to a reference voltage;
   generating an output based on the comparison;
   applying the output to a switched capacitor charge pump circuit; and
   based on the output, controlling a transfer of an amount of charge from the switched capacitor charge pump circuit to an output of the operational amplifier circuit using a control signal,
   wherein controlling the transfer of the amount of charge from the switched capacitor charge pump circuit to the output of the operational amplifier circuit using a control signal includes:
   controlling a transfer of the amount of charge to a feedback capacitor.

15. The method of claim 14, further comprising:
receiving the control signal, wherein the control signal is a clock signal having a fixed clock rate.

16. The method of claim 14, further comprising:
receiving the control signal, wherein the control signal is an enable signal.

17. The method of claim 14, further comprising:
performing an analog-to-digital conversion.

18. The method of claim 14, further comprising:
performing a sigma-delta analog-to-digital conversion.

19. The method of claim 14, further comprising:
performing an analog-to-digital conversion using a pipelined ADC circuit.

* * * * *

UNITED STATES PATENT AND TRADEMARK OFFICE
CERTIFICATE OF CORRECTION

PATENT NO. : 10,439,572 B1
APPLICATION NO. : 16/053415
DATED : October 8, 2019
INVENTOR(S) : Thompson et al.

It is certified that error appears in the above-identified patent and that said Letters Patent is hereby corrected as shown below:

On the Title Page

On page 2, in Column 1, item (56), under "Other Publications", Line 4, delete "Regulatred" and insert --Regulated-- therefor In the Claims In Column 10, Line 4, in Claim 8, delete "and." and insert --and-- therefor Signed and Sealed this
Second Day of June, 2020

Andrei Iancu
*Director of the United States Patent and Trademark Office*